(12) United States Patent
Zhang et al.

(10) Patent No.: US 10,937,998 B1
(45) Date of Patent: Mar. 2, 2021

(54) DISPLAY PANEL AND METHOD FOR PREPARING THE SAME, AND DISPLAY DEVICE

(71) Applicant: Chengdu BOE Optoelectronics Technology Co., Ltd., Chengdu (CN)

(72) Inventors: Hao Zhang, Beijing (CN); Youngyik Ko, Beijing (CN); Hengzhen Liang, Beijing (CN); Yi Zhang, Beijing (CN); Tingliang Liu, Beijing (CN); Tiaomei Zhang, Beijing (CN); Binyan Wang, Beijing (CN); Huijuan Yang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/825,034

(22) Filed: Mar. 20, 2020

(30) Foreign Application Priority Data

Nov. 28, 2019 (CN) .......................... 201911192738.1

(51) Int. Cl.
  *H01L 51/56* (2006.01)
  *H01L 51/52* (2006.01)
  *H01L 27/32* (2006.01)
(52) U.S. Cl.
  CPC .......... *H01L 51/56* (2013.01); *H01L 27/3246* (2013.01); *H01L 27/3276* (2013.01); *H01L 51/5253* (2013.01)

(58) Field of Classification Search
  CPC ............ H01L 51/0097; H01L 27/1218; H01L 27/3246; H01L 27/3225
  See application file for complete search history.

(56) References Cited

U.S. PATENT DOCUMENTS

2015/0381781 A1* 12/2015 Feng .................... H04M 1/0208
  455/566
2019/0252415 A1* 8/2019 Wan ..................... H01L 27/3246

* cited by examiner

*Primary Examiner* — Changhyun Yi
(74) *Attorney, Agent, or Firm* — Westman, Champlin & Koehler, P.A.

(57) ABSTRACT

A display panel, a method for preparing the same and a display device are provided. The display panel comprises: single package area which is single and closed; a surrounded area enclosed by the package area, with at least two installation holes formed therein and apart from each other, the at least two installation holes comprising a first installation hole and a second installation hole; and an active display area defined to surround the package area within the display area; and in a plane perpendicular to the display panel, the display panel comprises a substrate, an insulation layer and a packaging structure layer, all being stacked, the packaging structure layer comprising an inorganic packaging layer extending into an inter-hole area between the first installation hole and the second installation hole in the surrounded area, and an organic packaging layer not extending into the surrounded area.

18 Claims, 6 Drawing Sheets

DISPLAY PANEL AND METHOD FOR PREPARING THE SAME, AND DISPLAY DEVICE

CROSS-REFERENCE TO RELATED APPLICATION

The present disclosure claims the benefit of Chinese Patent Application Invention No. 201911192738.1 filed on Nov. 28, 2019 in the State Intellectual Property Office of China, the whole disclosure of which is incorporated herein by reference.

BACKGROUND

Field

Embodiments of the present disclosure generally relate to the technical field of display technology, and in particular, to a display panel and a method for preparing the same, and a display device.

Description of the Related Art

Organic light-emitting diode (OLED) is a type of active light-emitting display devices, which has the advantages such as self-illumination, relatively wide viewing angle, relatively high contrast, relatively low power consumption and relatively fast reaction speed, etc. With continuous development of display technology, OLED technology becomes more and more used in various display devices, especially in smart terminal products such as mobile phones and tablets and the like.

With the development of active matrix organic light-emitting diode (AMOLED) technology, the requirements for display area of a display device become higher and higher, such as full screen, borderless (i.e., bezel-free) screen, and the like, so as to bring more dazzling visual impact to users. Since it is typically required that products such as smart terminals and the like need to be provided with hardware such as a front-facing camera, an infrared sensor, a built-in earphone and the like, then, in order to achieve a full screen, a solution in which installation holes are provided in the display area for receiving the hardware such as the camera and the like therein, draws more and more attention. That is to say, with the solution in which installation holes are provided in the display area for receiving the hardware such as the camera and the like therein, a "full screen" may be achieved to some extent. However, once the display area is formed with the installation hole(s), then organic function layer and cathode may be exposed from a side wall of each installation hole, such that water and oxygen in the atmosphere may readily invade an active display area in the display area, resulting in a failure of the organic function layer in the active display area, and thereby bringing about poor display.

In the relevant art, in order to ensure effectiveness of the organic function layer of the active display area, a way in which a package area is provided around the installation hole(s) is typically adopted so as to avoid invasion of water and oxygen. With an increase in the functionalities of the display device, specific number of the installation holes formed in the display area also increases correspondingly, and each installation hole is provided with a respective package area therearound; however, the respective package area fails to display effectively. As such, an active display area of the display device is significantly decreased, reducing user's satisfaction.

SUMMARY

The embodiments of the present disclosure have been made to overcome or alleviate at least one aspect of the above mentioned disadvantages and/or shortcomings in the prior art, by providing a display panel and a method for preparing the same, and a display device.

Following technical solutions are adopted in exemplary embodiments of the disclosure.

According to the first aspect of the embodiment of the present disclosure, there is provided a display panel, comprising a display area, the display area comprises: a closed single package area; a surrounded area enclosed by the package area, with at least two installation holes which are formed in the surrounded area and space apart from each other or one another, the at least two installation holes comprising a first installation hole and a second installation hole; and an active display area, which is defined as an external area surrounding the package area within the display area; and in a plane perpendicular to the display panel, the display panel comprises a substrate, an insulation layer provided on the substrate, and a packaging structure layer provided on the insulation layer, all of these three layers being stacked, the packaging structure layer comprising an inorganic packaging layer and an organic packaging layer, the inorganic packaging layer extending into an inter-hole area between the first installation hole and the second installation hole in the surrounded area enclosed by the package area, and the organic packaging layer failing to extend into the surrounded area.

According to an exemplary embodiment of the present disclosure, the package area is in the form of a closed loop belt.

According to an exemplary embodiment of the present disclosure, the package area comprises: a first package section arranged along a periphery of the first installation hole, a second package section arranged along a periphery of the second installation hole, and a third package section connecting between the first package section and the second package section and functioning as a transition package section therebetween, the third package section being a straight section.

According to an exemplary embodiment of the present disclosure, in the plane perpendicular to the display panel, the package area is formed with: a portion of the substrate falling within the package area, a portion of the insulation layer on the substrate falling within the package area, and a dam provided on the insulation layer; and the inorganic packaging layer comprises a first inorganic packaging layer and a second inorganic packaging layer, and the package area is further formed with: respective portions of the first inorganic packaging layer, the organic packaging layer and the second inorganic packaging layer which are stacked on the dam and fall within the package area.

According to an exemplary embodiment of the present disclosure, the package area is further formed with a spacer column provided on the insulation layer, the spacer column is located on a side of the dam facing away from the first installation hole or the second installation hole, and the package area is further formed with: respective portions of an organic function layer and a cathode layer which are stacked on both the dam and the spacer column and fall within the package area, respectively, and the spacer column is arranged to insert into and split each of the organic function layer and the cathode layer on both sides of the spacer column, and the first inorganic packaging layer is located on the cathode.

According to an exemplary embodiment of the present disclosure, in the plane perpendicular to the display panel, the active display area surrounding the package area is formed with: a portion of the substrate falling within the active display area, a thin film transistor structure layer provided on the substrate, a first planarization layer provided on the thin film transistor structure layer, an anode layer provided on the first planarization layer, and a first pixel definition layer provided on the anode layer; and the dam comprises a first sub-dam and a second sub-dam sequentially stacked on a surface of the insulation layer, the first sub-dam and the first planarization layer are made of a same material and in a same layer, and the second sub-dam and the first pixel definition layer are made of a same material and in a same layer.

According to an exemplary embodiment of the present disclosure, the dam further comprises a third sub-dam stacked on the second sub-dam, and the third sub-dam and the spacer column are made of a same material and in a same layer.

According to an exemplary embodiment of the present disclosure, in the plane perpendicular to the display panel, the inter-hole area between the first installation hole and the second installation hole in the surrounded area enclosed by the package area comprises: a portion of data lines provided on the insulation layer falling within the inter-hole area, and a second planarization layer and/or a second pixel definition layer provided on the portion of the data lines falling within the inter-hole area, and the inorganic packaging layer is located on the second planarization layer and/or the second pixel definition layer.

According to an exemplary embodiment of the present disclosure, the inter-hole area between the first installation hole and the second installation hole in the surrounded area enclosed by the package area is further formed with: respective portions of an organic function layer and a cathode layer which are stacked on the second planarization layer and/or the second pixel definition layer and fall within the inter-hole area, and the inorganic packaging layer is located on the cathode.

In order to solve the above technical problem, according to the second aspect of the embodiment of the disclosure, there is provided a method for preparing a display panel, wherein the display panel comprises a display area, the display area comprises: a closed single package area; a surrounded area enclosed by the package area, with at least two installation holes which are formed in the surrounded area and space apart from each other or one another, the at least two installation holes comprising a first installation hole and a second installation hole; and an active display area, which is defined as an external area surrounding the package area within the display area, and the method comprises:

forming an insulation layer on a substrate, the insulation layer extending into an inter-hole area between the first installation hole and the second installation hole in the surrounded area enclosed by the package area; and forming a packaging structure layer provided on the insulation layer, the packaging structure layer comprising an inorganic packaging layer and an organic packaging layer, the inorganic packaging layer extending into the inter-hole area between the first installation hole and the second installation hole in the surrounded area enclosed by the package area, and the organic packaging layer failing to extend into the inter-hole area.

According to an exemplary embodiment of the present disclosure, the insulation layer extends into the package area, and the method further comprises:

forming a dam on the insulation layer in the package area, after the insulation layer is formed on the substrate but before the packaging structure layer is formed on the insulation layer.

According to an exemplary embodiment of the present disclosure, in a process of forming the packaging structure layer on the insulation layer, forming the inorganic packaging layer comprises:

forming a first inorganic packaging layer, the first inorganic packaging layer extending into the package area and covering the dam; and forming a second inorganic packaging layer, the second inorganic packaging layer covering the organic packaging layer in the package area.

According to an exemplary embodiment of the present disclosure, forming a packaging structure layer provided on the insulation layer further comprises: forming the organic packaging layer on the first inorganic packaging layer in the package area, with an ink-jet printing method, after the first inorganic packaging layer is formed but before the second inorganic packaging layer is formed.

According to an exemplary embodiment of the present disclosure, the active display area is an area which falls within the display area and is located outside the package area, and the dam comprises a first sub-dam and a second sub-dam sequentially stacked on a surface of the insulation layer, and the method further comprises:

forming a thin film transistor structure layer on the substrate in the active display area, with the insulation layer being formed in the process of forming the thin film transistor structure layer;

forming a first planarization layer on the thin film transistor structure layer in the active display area, with the first sub-dam and the first planarization layer both being formed in a same masking process;

forming an anode on the first planarization layer in the active display area; and forming a first pixel definition layer on the anode in the active display area, the second sub-dam and the first pixel definition layer being both formed in another same masking process.

According to an exemplary embodiment of the present disclosure, the dam further comprises a third sub-dam stacked on the second sub-dam, and after the first pixel definition layer is formed on the anode in the active display area, the method further comprises:

forming a spacer column on the insulation layer in the package area, the third sub-dam and the spacer column being both formed in still another same masking process.

According to an exemplary embodiment of the present disclosure, forming a packaging structure layer provided on the insulation layer comprises:

forming data lines on the insulation layer, a portion of the data lines falling within the inter-hole area between the first installation hole and the second installation hole;

forming a second planarization layer and/or a second pixel definition layer in the inter-hole area between the first installation hole and the second installation hole in the surrounded area enclosed by the package area, the second planarization layer and/or the second pixel definition layer covering the portion of the data lines falling within the inter-hole area between the first installation hole and the second installation hole; and forming the inorganic packaging layer, the inorganic packaging layer extending into the inter-hole area between the first installation hole and the second installation hole in the surrounded area enclosed by the package area, and covering the second planarization layer and/or the second pixel definition layer.

According to an exemplary embodiment of the present disclosure, forming a packaging structure layer provided on the insulation layer further comprises, prior to forming the inorganic packaging layer:

forming an organic function layer, the organic function layer extending into the inter-hole area between the first installation hole and the second installation hole and covering the second planarization layer and/or the second pixel definition layer by directly abutting thereon; and forming a cathode covering the organic function layer, the cathode extending into the inter-hole area between the first installation hole and the second installation hole In order to solve the above technical problem, according to the third aspect of the embodiment of the present disclosure, there is provided a display device, comprising the display panel described above.

BRIEF DESCRIPTION OF THE DRAWINGS

In order to more clearly illustrate technical solutions of the embodiments of the present disclosure, the drawings required to be used with the description of the embodiments of the present disclosure will be briefly described below. It is apparent that the drawings in the following description are merely some embodiments of the present disclosure. For those skilled in the art, other drawings can be obtained according to these drawings without paying any creative efforts. The drawings are used to provide a further understanding of the technical solution of the disclosure, and form a portion of the specification, and are used together with the embodiments of the disclosure to interpret the technical solution of embodiments of the disclosure, rather than forming a limitation of the technical solution of embodiments of the disclosure.

FIG. 1b is an enlarged structural schematic view of section B-B in FIG. 1a;

FIG. 2b is an enlarged structural schematic view of a package area in FIG. 2a;

FIG. 3 is the structural schematic view of section C-C in FIG. 2a;

DETAILED DESCRIPTION

Figure 1A:
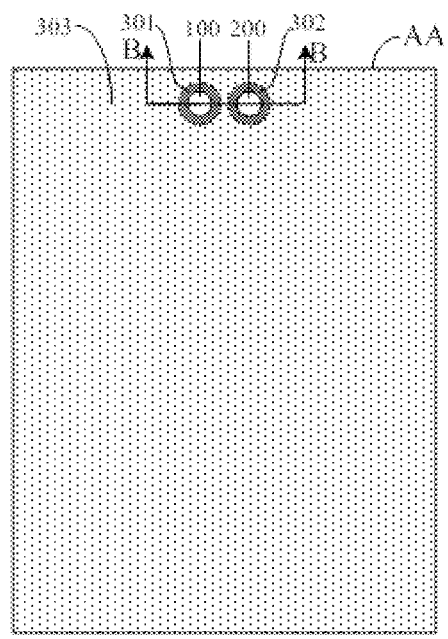
FIG. 1a is a planar structural schematic view of an OLED display panel.

In order to make the object, technical solution and advantages of the disclosure clearer, a detailed description of the embodiments of the disclosure will be described in detail hereinafter, in combination with the accompanying drawings. It should be noted that, the embodiments in the present disclosure and the features in the embodiments can be arbitrarily combined with each other, without any conflict.

Embodiments of the present disclosure will be described in detail below, and examples of the embodiments are shown in the accompanying drawings, in which the same or similar reference numerals represent the same or similar elements or elements with the same or similar functions, throughout the present disclosure. The embodiments described below with reference to the accompanying drawings are exemplary, merely intending to interpret the present disclosure, rather than being interpreted as a limitation of the present disclosure. For clarity, various components of the drawings are not drawn to scale. In addition, some known parts may not be shown in the figure.

Many specific details of the embodiments of the present disclosure, such as respective structure, material, size, processing technology of the components, are described below to provide a more thorough and clearer understanding of the embodiments of the present disclosure. It may easily occur to those skilled in the art that, embodiments of the present disclosure may be implemented without these specific details.

Respective dimension and shape of each component in the drawings are only intended to exemplarily illustrate the contents of the disclosure, rather than to demonstrate the practical dimensions or proportions of components of a display panel and a display device according to an embodiment of the disclosure.

Figure 1B:
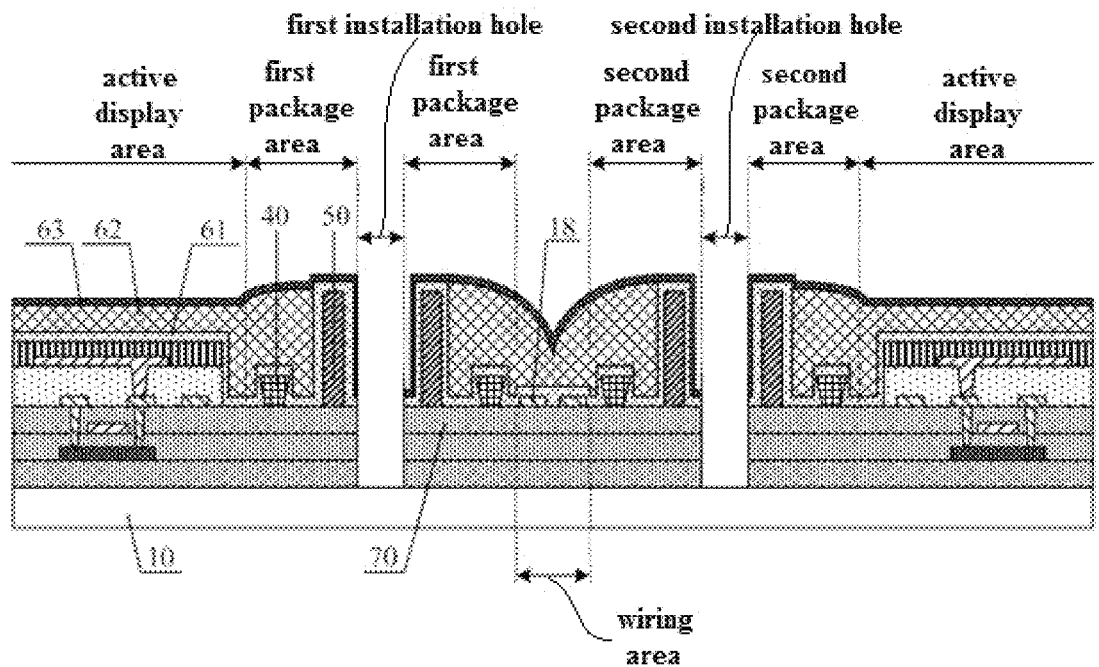

FIG. 1a is a planar structural schematic view of an OLED display panel; FIG. 1b is an enlarged structural schematic view of section B-B in FIG. 1a. As illustrated in FIG. 1a and FIG. 1b, the display panel comprises a display area labeled by 'AA', in which a first installation hole 100 and a second installation hole 200 are provided, which are neither connected with nor communicated with each other; i.e., they are spaced apart from each other. For example, the first installation hole 100 and the second installation hole 200 are configured to install hardware therein, such as cameras, infrared sensors, earphones, etc.; and the first installation hole 100 and the second installation hole 200 are for example in the form of through-holes, or alternatively in the form of blind holes, and the specific form of the first installation hole and the second installation hole may be set as required. In specific implementations, as compared with a length or a width of the display panel, or even the sizes of the first installation hole and the second installation hole themselves, a distance between the first installation hole 100 and the second installation hole 200 is relatively smaller. Therefore, as to a space area formed between the first installation hole 100 and the second installation hole 200, since such space area occupies an area much smaller than the area of the display area 'AA' or even respective sectional area of the first installation hole and the second installation hole, then said space area may typically be provided with no light-emitting pixel therein. In order to prevent water and oxygen from invading an organic light-emitting layer and a cathode inside the display panel through the side wall of any one of the first installation hole and the second installation hole, then, a first package area 301, which is for example in the form of a ring shape, is provided around a periphery of the first installation hole 100, and a second package area 302, which is for example in the form of a ring shape, is provided around a periphery of the second installation hole 200; accordingly, in the area 'AA', an active display area 303 is an area surrounding respective peripheries of both the first package area 301 and the second package area 302.

As illustrated in FIG. 1b, in the section B-B perpendicular to the substrate, a main structure of the active display area 303 comprises: a driving structure layer, a light-emitting structure layer and a packaging layer, all provided on the substrate 10 in a direction facing away from the substrate 10, and in turn defining a plurality of light-emitting units arranged in an array, cooperatively. The driving structure layer comprises a plurality of thin-film transistors (for example, also arranged in an array); accordingly, the plurality of light-emitting units may be driven respectively by the plurality of thin-film transistors in one-to-one correspondence so as to emit light beams; in other words, each light-emitting unit comprises a thin-film transistor. Here, "correspondence" means that an orthogonal projection of each thin film transistor on the substrate at least partially overlaps with an orthogonal projection of a respective one light-emitting unit on the substrate, and in some embodiments, the orthogonal projection of each thin film transistor on the substrate completely may even completely fall within the range of the orthogonal projection of the respective one light-emitting unit on the substrate. In a more specific embodiment, for example, as illustrated in FIG. 1b, merely one light-emitting unit and one thin film transistor are exemplarily shown on either one of a left side of the first package area 301 and a right side of the second package area 302 for illustration. The packaging layer comprises a first inorganic packaging layer 61, an organic packaging layer 62 and a second inorganic packaging layer 63 stacked on one another. A main structure of the first package area comprises: a dam 50 arranged around the first installation hole; a spacer column (or referred to as "post spacer", alternatively) 40 arranged around the dam 50; and a corresponding portion of an insulation layer 70 on the substrate 10, below the spacer column 40 and the dam 50, herein the word "corresponding" means that an orthogonal projection of both the spacer column 40 and the dam 50 on a surface of the insulation layer 70 at least partially overlaps with, or even more specifically is completely contained in an area occupied by an orthogonal projection of the corresponding portion of the insulation layer 70 on the insulation layer 70. More specifically, for example, the spacer column 40 is arranged to space apart the dam 50 from the active display area 303 of the display area AA outside both the first package area 301 and the second package area 302 (more specifically, surrounding respective peripheries of both the first package area 301 and the second package area 302), and the spacer column has its longitudinal section typically in the form of a trapezoidal shape with a narrower top and a wider bottom, and thereby is bonded firmly at a root portion thereof with the insulation layer 70, preventing water and oxygen from exiting (i.e., escaping from, e.g., overflowing from or leaking out of) respective side walls of the installation holes and in turn invading the active display area of OLED (i.e., the trapezoidal section is also favorable in resisting impact of water and oxygen escaping therefrom at a pressure), with its height being not necessarily set to be greater than or consistent with that of the dam; therefore, the height of the spacer column 40 may for example be typically set to be lower than that of the dam, slightly protruding upwards from a surface of the insulation layer which is underlying. The first package area further comprises an "overlying portion" in the packaging layer, and the overlying portion is defined to comprise respective portions of the first inorganic packaging layer 61, the organic packaging layer 62 and the second inorganic packaging layer 63 falling within the range of the first package area. The second package area has its structure the same as that of the first package area, without being repeated herein any more. Following description of each of both the first package area and the second package area is illustrated by taking the first package area as an example. A non-package area between the first installation hole and the second installation hole (i.e., an area between the first package area and the second package area) is provided with a wiring area or routing area, which is for example configured such that wirings are provided therein, comprising but not limited to data wirings.

It may be readily understood that, in the first package area, at a side of the dam 50 facing towards the first installation hole, a certain cut margin is reserved along a position of the periphery of the first installation hole which is expected to be formed, so as to facilitate forming the first installation hole later by cutting with laser, within a range defined by the cut margin. Similarly, a cut margin is also reserved in the second package area.

In the display panel in the relevant art as illustrated in FIG. 1a and FIG. 1b, a full screen may be realized to a certain extent. However, the first package area and the second package area fail to display effectively, and a total area of both the first package area and the second package area increase continuously with an increase in the number of the installation holes, resulting in a decrease in the active display area of the display panel, thereby reducing the display quality of the full screen and user's satisfaction.

According to a general technical concept of embodiments of the disclosure, in order to solve the above technical problems, a display panel is provided in embodiments of the disclosure. The display panel comprises a display area, wherein the display area comprises: a closed single package area; a surrounded area enclosed by the package area, with at least two installation holes which are formed in the surrounded area and space apart from each other or one another, the at least two installation holes for example comprising a first installation hole and a second installation hole; and an active display area, which is defined as an external area surrounding the package area within the display area; and in a plane perpendicular to the display panel, the display panel comprises a substrate, an insulation layer provided on the substrate, and a packaging structure layer provided on the insulation layer, all of these three layers being stacked, the packaging structure layer comprising an inorganic packaging layer and an organic packaging layer, the inorganic packaging layer extending into an inter-hole area between the first installation hole and the second installation hole in the surrounded area enclosed by the package area, and the organic packaging layer failing to extend into the surrounded area.

In the display panel according to embodiments of the disclosure, the package area is provided around at least two installation holes which space apart from each other or one another (e.g., the first installation hole and the second installation hole), without any portion of the organic packaging layer being provided between the first installation hole and the second installation hole. As such, neither spacer column nor dam is required to be provided between the first installation hole and the second installation hole any more, such that a closed single package area is defined to surround at least the first installation hole and the second installation hole. Therefore, as compared with the display panel in the relevant art as illustrated in FIG. 1b (in such a display panel, an inter-hole area between the first package area and the second package area functions as a wiring area), in the display panel of the embodiments of the present application, the inter-hole area between the first installation hole and the second installation hole in the surrounded area enclosed by the package area, which functions as the wiring area, may be further decreased in total area, so as to reduce the distance between the first installation hole and the second installation hole, and in turn to decrease the area of the surrounded area enclosed by the package area, resulting in a contracted outer boundary of the package area, thus increasing the area of the active display area and improving the display quality and user's satisfaction of the full screen.

The technical content of embodiments of the disclosure will be introduced in detail through specific embodiments hereinafter.

Figure 2A:
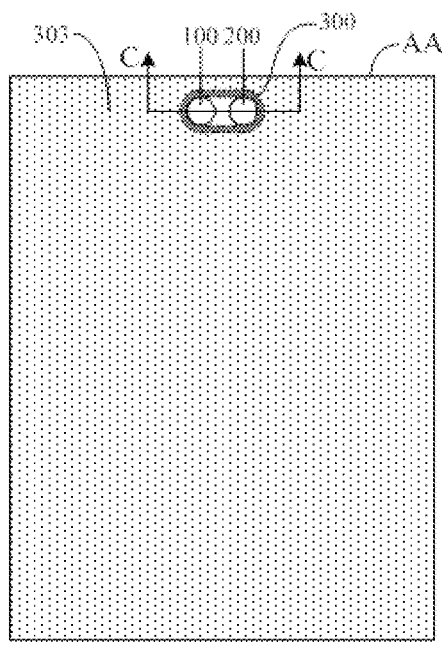
FIG. 2a is a planar structural schematic view of a display panel according to a first embodiment of the present invention.
Figure 2B:
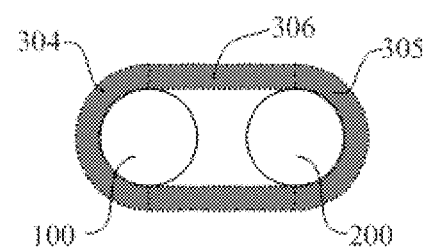

In some embodiments of the present disclosure:

FIG. 2a is a planar structural schematic view of a display panel according to a first embodiment of the present invention; FIG. 2b is an enlarged structural schematic view of a package area in FIG. 2a; and FIG. 3 is the structural schematic view of section C-C in FIG. 2a.

According to the general technical concept of embodiment of the disclosure, in one aspect of the embodiments of the disclosure, there is provided a display panel, as illustrated in FIG. 2a, in a plane parallel to a surface of the display panel as illustrated, it is schematically illustrated that the display panel comprises a display area labeled by 'AA', the display area is formed with at least two installation holes which space apart from each other or one another, e.g., a first installation hole 100 and a second installation hole 200; and the display area also comprises a closed single package area 300 which is for example an area in the form of a closed loop belt, more specifically for example a closed elliptical ring area; and the display area further comprises a surrounded area enclosed by the package area, with the aforementioned at least two installation holes which are formed in the surrounded area (e.g., both the first installation hole 100 and the second installation hole 200). And an active display area 303 of the display panel is formed in an area surrounding the package area within the display area. Respective positions and shapes of the first installation hole 100 and the second installation hole 200 in the display area are not limited; by way of example, the first installation hole 100 and the second installation hole 200 may for example be in the form of round shape as illustrated in FIG. 2a, or alternatively in the form of other shapes, such as oval shape, square shape, diamond shape, etc. In embodiments of the disclosure, an instance in which two installation holes are surrounded by the package area is taken as an example for illustration; it may be readily understood that, in alternative embodiments, more installation holes (e.g., three or more installation holes) may be provided which space apart from one another; furthermore, the installation holes may for example arranged linearly relative to each other or one another.

Figure 3:
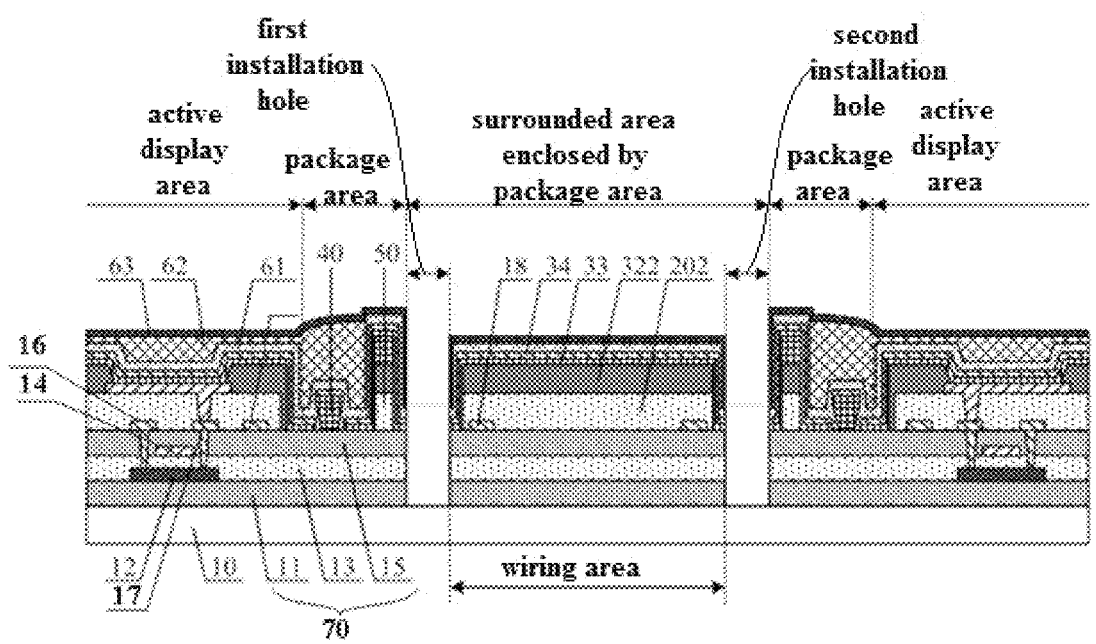

As illustrated in FIG. 3, in the section C-C perpendicular to the display panel, a main structure of the display area comprises: a driving structure layer, a light-emitting structure layer and a packaging structure layer, all of which are provided on a substrate 10 and arranged in a direction facing away from the substrate 10, defining a plurality of light-emitting units arranged in an array, cooperatively.

The driving structure layer comprises a thin-film transistor structure layer, for example, the thin-film transistor structure layer comprises a plurality of thin-film transistors (for example, also arranged in an array); accordingly, the plurality of light-emitting units are driven respectively by the plurality of thin-film transistors in one-to-one correspondence so as to emit light beams; in other words, each light-emitting unit comprises a thin-film transistor. Here, "correspondence" means that an orthogonal projection of each thin film transistor on the substrate at least partially overlaps with an orthogonal projection of a respective one light-emitting unit on the substrate, and in some embodiments, the orthogonal projection of each thin film transistor on the substrate completely may even completely fall within the range of the orthogonal projection of the respective one light-emitting unit on the substrate. In FIG. 3, merely one light-emitting unit and one thin film transistor are exemplarily shown on a left side of the first installation hole for illustration. Specifically, as illustrated in FIG. 3 and FIGS. 4a to 4c, the thin film transistor structure layer mainly comprises: a buffer layer 11 provided on the substrate 10; an active layer 12 provided on the buffer layer 11; a first insulation layer 13 provided on the active layer 12; a gate electrode 14 provided on the first insulation layer 13; a second insulation layer 15 provided on the gate electrode 14; and a source electrode 16, a drain electrode 17 as well as a data line 18 which are provided on the second insulation layer 15; all these layers being stacked. The source electrode 16 and the drain electrode 17 are electrically connected with the active layer 12 respectively, via respective through-holes which are formed to extend through the second insulation layer 15 and the first insulation layer 13. Here, an insulation layer 70 is formed on the substrate 10 in a process of forming the driving structure layer, and is defined to comprise various individual insulation layers prepared in a process of forming the thin film transistor; therefore, as illustrated in FIG. 3, more specifically, the insulation layer 70 comprises, for example, the buffer layer 11, the first insulation layer 13 on the buffer layer 11, and the second insulation layer 15 on the first insulation layer 13.

Figure 4A:
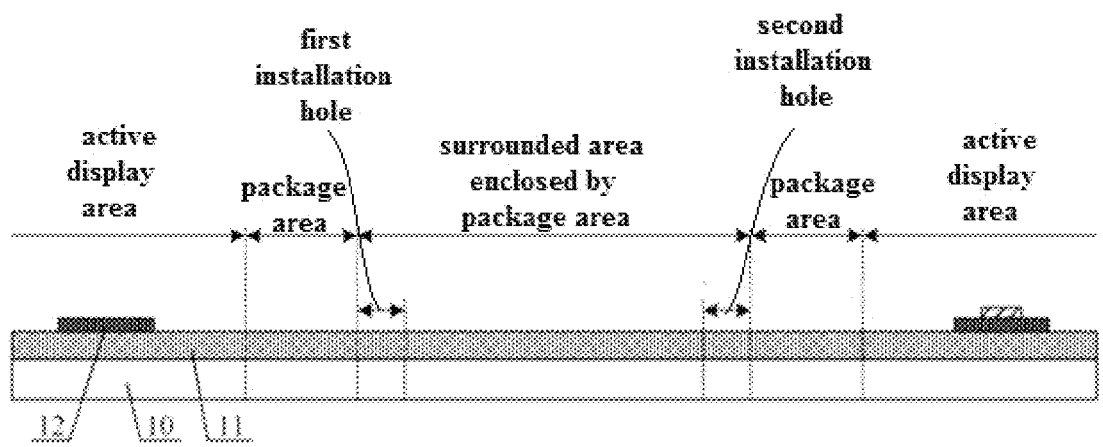
FIG. 4a is a structural schematic view of the display panel once it is formed with an active layer.
Figure 4B:
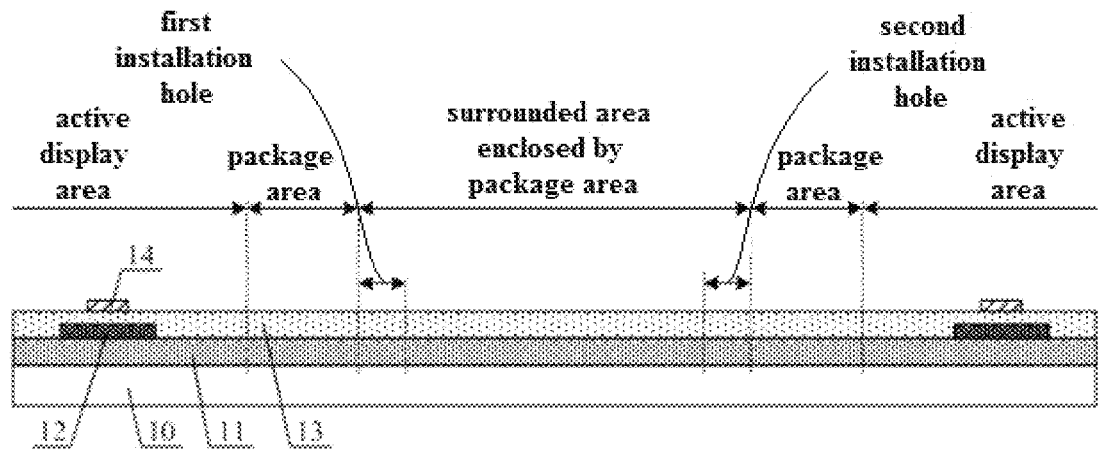
FIG. 4b is a structural schematic view of the display panel once it is formed with gate electrodes.
Figure 4C:
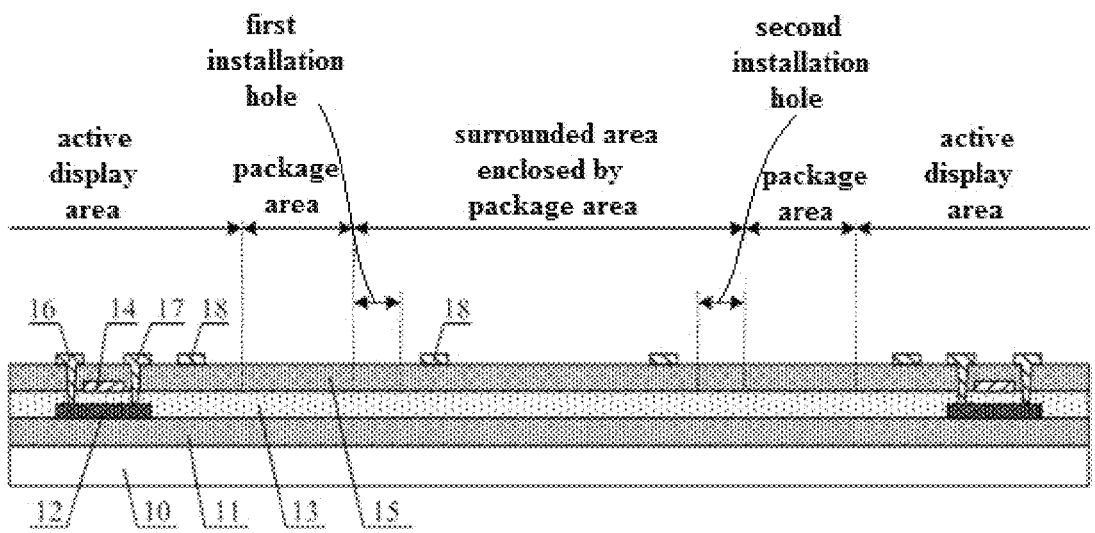
FIG. 4c is a structural schematic view of the display panel once it is formed with source/drain electrodes and data lines.
Figure 4D:
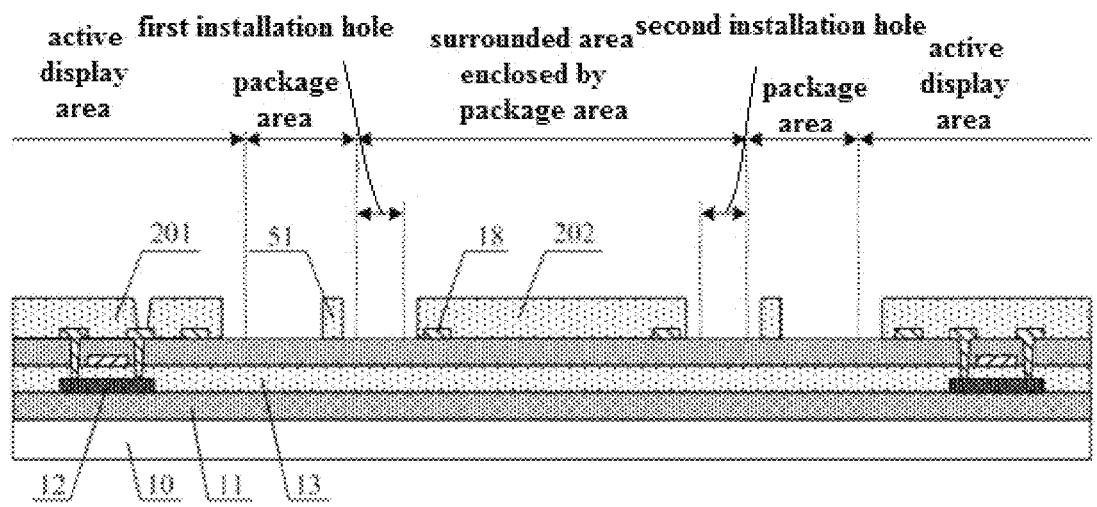
FIG. 4d is a structural schematic view of the display panel once it is formed with a planarization layer.

As illustrated in FIG. 3 and FIG. 4d, the driving structure layer further comprises a first planarization layer 201 provided on the thin film transistor structure layer.

As illustrated in FIG. 3 and FIGS. 4e, 4f and 4h, the light-emitting structure layer comprises an anode 31 disposed on the first planarization layer 201, a first pixel definition layer 321 disposed on the anode 31 and defining a pixel opening, an organic function layer 33 disposed on the first pixel definition layer 321 and within the pixel opening, and a cathode 34 disposed on the organic function layer 33.

As illustrated in FIG. 3, the packaging structure layer comprises a first inorganic packaging layer 61, an organic packaging layer 62, and a second inorganic packaging layer 63, which are successively stacked on the light-emitting structure layer.

As illustrated in FIG. 3, the main structure of the package area comprises: a dam 50 arranged around at least two installation holes which are neither connected with nor communicated with each other (e.g., the first installation hole 100 and the second installation hole 200 as illustrated); a spacer column (or referred to as "post spacer", alternatively) 40 provided on a side of the dam 50 facing towards the active display area (that is, the spacer column 40 is provided on a side of the dam 50 facing away from the first installation hole or the second installation hole, i.e., the spacer column 40 is provided on an external side of the dam 50, as illustrated); and a corresponding portion of an insulation layer 70 on the substrate 10, below the spacer column 40 and the dam 50 and falling within the package area, herein the word "corresponding" means that an orthogonal projection of both the spacer column 40 and the dam 50 on the substrate 10 at least partially overlaps with, or even more specifically is completely contained in an orthogonal projection of the corresponding portion of the insulation layer 70 on the substrate 10. Specifically, corresponding portion of an insulation layer 70 is provided on the substrate 10; the spacer column 40 and the dam 50 are provided on a surface of the corresponding portion of the insulation layer 70. The dam 50 is arranged around at least two installation holes which are neither connected with nor communicated with each other (e.g., the first installation hole 100 and the second installation hole 200 as illustrated), by way of example, the dam is arranged around both the first installation hole 100 and the second installation hole 200 each being in the form of oval shape, and the spacer column 40 is in turn provided around the dam 50. As illustrated in FIG. 3, the package area further comprises respective portions of the organic function layer 33 and the cathode 34 on the spacer column 40 and the dam 50. An orthogonal projection of a side of the spacer column 40 proximal to the substrate 10 on the substrate 10 is located within an orthogonal projection of another side of the spacer column 40 distal to the substrate 10 on the substrate 10; more specifically, for example, in a plane perpendicular to the surface 10, a section of the spacer column 40 is in the form of an inverted trapezoidal shape structure, such that the spacer column 40 is arranged to insert into and split each of the organic function layer and the cathode layer on both sides of the spacer column 40, preventing water and oxygen from invading OLED at respective side walls of the installation holes. And the package area further comprises respective portions of the first inorganic packaging layer 61, the organic packaging layer 62 and the second inorganic packaging layer 63 being filled in the package area (i.e., the portion of the packaging structure layer falling into the package area), these layers 61 to 61 are stacked on the cathode 34 sequentially.

In one embodiment, as illustrated in FIGS. 3 and 4e to 4g, the dam 50 comprises, for example, a first sub-dam 51, a second sub-dam 52 and a third sub-dam 53 sequentially stacked on a surface of the insulation layer 70. The first sub-dam 51 is for example formed together with the first planarization layer 201, more specifically they are made of a same material and in a same layer, e.g., by a single masking process; the second sub-dam 52 is for example then formed together with the first pixel definition layer 321 located above the first planarization layer 201, more specifically they are made of a same material and in a same layer, e.g., by another single masking process; and the third sub-dam 53 is for example in turn formed together with the spacer column 40, more specifically they are made of a same material and in a same layer, e.g., by still another masking process. It may be readily understood that, in other embodiments, both the spacer column and the dam may be formed otherwise, as long as they are the same in structure as those as illustrated in FIG. 3, and all of these structures fall within a scope of protection of embodiments of the disclosure.

In FIG. 3, a spacer column and a dam are schematically illustrated. It may be readily understood that, specific number of the spacer column may be set to be plural as desired, and the specific number of the dam may also be set to be plural as desired; and a plurality of spacer columns are located on respective sides of the plurality of dams facing towards the active display area (i.e., respective sides of the plurality of dams facing away from the first installation hole or the second installation hole, e.g., external sides of the plurality of dams).

As illustrated in FIG. 3, in the surrounded area enclosed by the package area, between the first installation hole and the second installation hole, there are formed with: a portion of the substrate 10 falling therein, a portion of the insulation layer 70 on the substrate 10 falling therein, and a portion of the packaging structure layer disposed above the insulation layer 70 falling therein (merely comprising the material of the inorganic packaging layers). The portion of the packaging structure layer falling between the first installation hole and the second installation hole merely comprises the material of the inorganic packaging layers, more specifically, for example as illustrated in FIG. 3, only comprises respective portions of the first inorganic packaging layer 61 and the second inorganic packaging layer 63 sequentially stacked and falling between the first installation hole and the second installation hole, without the material of the organic packaging layer.

In such a structure, as compared with the display panel shown in FIG. 1a and FIG. 1b, the display panel of the embodiments of the disclosure, as described in FIG. 2a and FIG. 3, the package area 300 is provided around at least two installation holes which space apart from each other or one another (e.g., the first installation hole and the second installation hole as illustrated), without any portion of the organic packaging layer being provided between the first installation hole and the second installation hole. As such, in the package area, it is unnecessary to provide any spacer column or dam within an inter-hole area between the first installation hole and the second installation hole, resulting in that merely a closed single package area at least surrounding the first installation hole and the second installation hole is defined; therefore, as compared with the display panel in the relevant art as illustrated in FIG. 1b (in such a display panel, its inter-hole area between the first package area and the second package area functions as a wiring area), in the display panel of the embodiments of the present application, the inter-hole area between the first installation hole and the second installation hole in the surrounded area enclosed by the package area, which functions as the wiring area, may be further decreased in total area, so as to reduce the distance between the first installation hole and the second installation hole, and in turn to decrease the area of the surrounded area enclosed by the package area, resulting in a contracted outer boundary of the package area, thus increasing the area of the active display area and improving the display quality and user's satisfaction of the full screen.

In some embodiments, the inter-hole area between the first installation hole and the second installation hole further comprises: the data line 18 provided on the insulation layer 70 and between the first installation hole and the second installation hole; and respective portions of a second planarization layer 202 covering the data line 18 and a second pixel definition layer 322 on the second polarization layer 202. And the inorganic packaging layers are provided on the second pixel definition layer 322. It may be readily understood that, in specific implementations, at least one of the second planarization layer 202 and the second pixel definition layer 322 may for example be provided on the data line 18, so as to prevent the data line from contacting the organic function layer or the cathode when the organic function layer and cathode are subsequently formed.

In some embodiments, the inter-hole area between the first installation hole and the second installation hole further comprises: a portion of the organic function layer 33 disposed on the second pixel definition layer 322 between the first and second installation holes, a portion of the cathode 34 disposed on the organic function layer 33 between the first and second installation holes, and a portion of the inorganic packaging layer disposed on the cathode 34 between the first and second installation holes. It may be readily understood that the data line 18 and the source/drain electrode of the thin film transistor are formed by a single patterning process, and the second planarization layer 202 and the first planarization layer 201 are formed by another single masking process. And the active display area, the package area, the first inorganic packaging layer and the second inorganic packaging layer of the inter-hole area between the first installation hole and the second installation hole are formed at the same time.

In the display panel of the embodiments of the disclosure, the inter-hole area between the first installation hole and the second installation hole may function as the wiring area, which is configured such that wirings are provided therein, comprising but not limited to the data line 18. As compared with the wiring area between the first package area and the second package area as illustrated in FIG. 1b, since there is neither spacer column 40 nor dam 50 additionally provided in the inter-hole area between the first installation hole and the second installation hole, then more space may be available for routing wirings therein, then the wiring area as illustrated in FIG. 3 has its width much larger than that of the wiring area as illustrated in FIG. 1b. The wiring area is configured such that wirings are provided therein; provided that both width and spacing of data line remain unchanged, then, in the wiring area whose specific area is increased in embodiments as illustrated in FIG. 4, the data line may be laid to occupy/cover larger area, thus reducing the difficulty in laying wirings in the display panel. Moreover, provided that width, spacing and number of data line(s) between the first installation hole and the second installation hole remain unchanged, then it means that the width of the wiring area as required in FIG. 4 may be decreased; as such, the distance between the first installation hole and the second installation hole may then be further reduced (that is, the first installation hole and the second installation hole may be set closer to each other), and thereby the area of the surrounded area enclosed by the package area may in turn be reduced, resulting in a contracted outer boundary of the package area 300, thus increasing the area of the active display area and improving the display quality and user's satisfaction of the full screen.

Next, the technical solution of the embodiments of the disclosure will be further illustrated by taking a process for preparing the display panel of the embodiments of the disclosure. It may be readily understood that, said "patterning process" in embodiments of the disclosure comprises processing steps such as: depositing a film layer, coating a photoresist, exposing with a mask, development, etching, stripping of the photoresist, and the like; and a "lithography process" in embodiments of the disclosure comprises processing steps such as: coating a film layer, exposing with a mask, development and the like; and evaporation, deposition, coating/applying and the like in embodiments of the disclosure are mature preparation processes in the relevant art.

The process for preparing the display panel comprises:

Step S1: forming a driving structure layer. Specific processes of forming the driving structure layer comprise following sub-steps:

Sub-step S11: forming a pattern of an active layer on a substrate, specifically comprising: above all, a layer of buffer film is deposited on the substrate 10, so as to form a pattern of a buffer layer 11 covering the whole substrate 10; then, a layer of active layer film is deposited thereon and is in turn patterned by a patterning process, so as to form a pattern of an active layer 12 on the buffer layer 11 within the active display area, as illustrated in FIG. 4a. FIG. 4a is a structural schematic view of the display panel once it is formed with an active layer, among others, the pattern of the active layer 12 is merely formed in the active display area, rather than that any portion of the pattern of the active layer 12 is formed in the package area and the surrounded area enclosed by the package area; in other words, in the package area and the surrounded area enclosed by the package area, merely a portion of the pattern of the buffer layer 11 is formed therein, without any portion of the pattern of the active layer 12 being formed therein; and the first installation hole and the second installation hole are located in the surrounded area enclosed by the package layer. The substrate 10 is for example a flexible substrate which is formed by a material such as polyimide (PI), polyethylene terephthalate (PET), a polymer soft film processed by surface treatment, etc. By way of example, the buffer film is a single layer formed by a material, such as silicon nitride SiNx, silicon oxide SiOx, etc, or alternatively is a multi-layer structure formed by one or more materials such as silicon nitride, silicon oxide, and the like.

Sub-step S12: forming a pattern of a gate electrode, specifically comprising: above all, a first insulation film and a first metal film are deposited on the substrate 10 which is formed with above structures, and then the first metal film is patterned by using a patterning process, thereby forming a pattern of a first insulation layer 13 covering the active layer 12 and the buffer layer 11, and respective patterns of a gate electrode 14 and a gate line on the first insulation layer 13, as illustrated in FIG. 4b. FIG. 4b is a structural schematic view of the display panel once it is formed with gate electrode 14, and the gate electrode 14 covers a portion of the first insulation layer 13. The gate electrode 14 is formed in the active display area; and in the package area and the surrounded area enclosed by the package area at that time, there are formed with a portion of the pattern of the buffer layer 11 and a portion of the pattern of the first insulation layer 13 stacked thereon. Then the first insulation layer 13 is also referred to as a gate insulation layer (GI).

Sub-step S13: forming patterns of a source electrode, a drain electrode and a data line, specifically comprising: a second insulation film and a second metal film are deposited sequentially on the substrate 10 which is formed with above structures, and then the second metal film is patterned by using a patterning process, thus forming a second insulation layer 15 covering both the gate electrode 14 and a portion of the first insulation layer 13 not covered by the gate electrode, and a source electrode 16 and a drain electrode 17 as well as a data line 18 all provided on the second insulation layer 15. The source electrode 16 and the drain electrode 17 are electrically connected with the source electrode 12 respectively via respective first through-holes (the first through-holes all extend through the first insulation layer 13 and the second insulation layer 15), and a portion of the data line 18 is illustrated to be provided within the active display area, while the other portion of the data line 18 is additionally provided in the surrounded area enclosed by the package area and between the first installation hole and the second installation hole, as illustrated in FIG. 4c. FIG. 4c is a structural schematic view of the display panel once it is formed with source/drain electrodes and data lines. Then, in the package area and the surrounded area enclosed by the package area, there are formed with a portion of the pattern of the buffer layer 11 located therein, a portion of the pattern of the first insulation layer 13 located therein, and a portion of a pattern of the second insulation layer 15 located therein; moreover, the inter-hole area between the first installation hole and the second installation hole in the surrounded area enclosed by the package layer is further formed with another portion of the data line 18 located on the second insulation layer 15. The second insulation layer 15 is referred to as an interlay insulation layer (ILD).

Sub-step S14: forming a planarization layer and a first sub-dam, specifically comprising: a planarization film is further coated on the aforementioned structures formed on the substrate, and then the planarization film is patterned through a lithography process of exposing with a mask and development, thereby forming the planarization layer and the first sub-dam. The planarization layer comprises a first planarization layer 201 located in the active display area and a second planarization layer 202 located in the surrounded area enclosed by the package area and between the first installation hole and the second installation hole. The first planarization layer 201 is provided with a second through-hole exposing the drain electrode 17. The first sub-dam 51 is located in the package area, and a portion of the planarization film outside both the planarization layer and the first sub-dam has been removed, as illustrated in FIG. 4d. FIG. 4d is a structural schematic view of the display panel once it is formed with a planarization layer. At such a time, in the area in the surrounded area enclosed by the package area and located between the first installation hole and the second installation hole, there are formed with a first portion of the pattern of the buffer layer 11, a first portion of the pattern of the first insulation layer 13, a first portion of the pattern of the second insulation layer 15, a first portion of the pattern of the data line 18 (here respective "first portion(s)" means respective portions falling inside the surrounded area and between the first installation hole and the second installation hole in the surrounded area), and a pattern of the second planarization layer 202 covering the first portion of the pattern of the data line 18; and in the area in the surrounded area enclosed by the package area and at the positions of the first installation hole and the second installation hole, there are formed with a second portion of the pattern of the buffer layer 11 different from the first portion thereof, a second portion of the pattern of the first insulation layer 13 different from the first portion thereof, and a second portion of the pattern of the second insulation layer 15 different from the first portion thereof (here respective "second portion(s)" means respective portions at the positions of the first installation hole and the second installation hole in the surrounded area). And in the package area, there are formed with a third portion of the pattern of the buffer layer 11 different from the first portion and the second portion thereof, a third portion of the pattern of the first insulation layer 13 different from the first portion and the second portion thereof, a third portion of the pattern of the second insulation layer 15 different form the first portion and the second portion thereof, and a first sub-dam 51 on the second insulation layer 15 (here respective "third portion(s)" means respective portions falling inside the surrounded area).

Figure 4E:
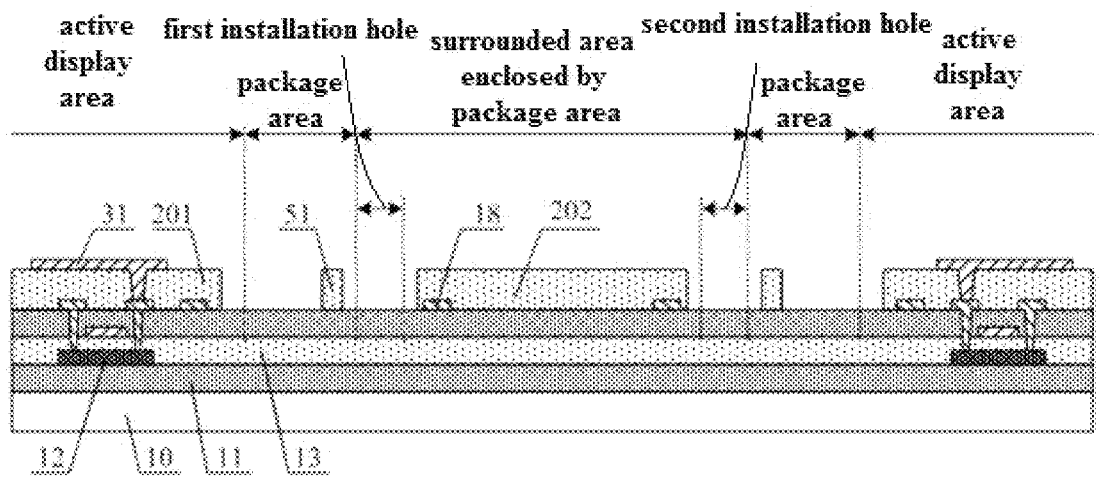
FIG. 4e is a structural schematic view of the display panel once it is formed with an anode.

Step S2: forming a light-emitting structure layer on the driving structure layer. Specific processes of forming the light-emitting structure layer comprise following sub-steps:

Sub-step S21: forming an anode located in the active display area, specifically comprising: a conductive film is further deposited on the aforementioned structures formed on the substrate, and is then patterned by a patterning process, thereby forming an anode 31 in the active display area, the anode 31 being electrically connected with the drain electrode 17 via a second through-hole, as illustrated in FIG. 4e. FIG. 4e is a structural schematic view of the display panel once it is formed with an anode 31 which is formed in the active display area, with respective portions of the conductive film in the package area and the surrounded area enclosed by the package area being etched. At such a time, in the package area, there are formed with the third portion of the pattern of the buffer layer 11, the third portion of the pattern of the first insulation layer 13, the third portion of the pattern of the second insulation layer 15, and the first sub-dam 51 on the second insulation layer 15; in the surrounded area enclosed by the package area, at locations of the first installation hole and the second installation hole, there are formed with the second portion of the pattern of the buffer layer 11, the second portion of the pattern of the first insulation layer 13 and the second portion of the pattern of the second insulation layer 15; in the surrounded area enclosed by the package area, in the inter-hole area between the first installation hole and the second installation hole, there are formed with the first portion of the pattern of the buffer layer 11, the first portion of the pattern of the first insulation layer 13, the first portion of the pattern of the second insulation layer 15, the first portion of the pattern of the data line 18, and the second planarization layer 202 covering the first portion of the pattern of the data line 18. The conductive film is for example formed by indium tin oxide (ITO) or indium zinc oxide (IZO).

Figure 4F:
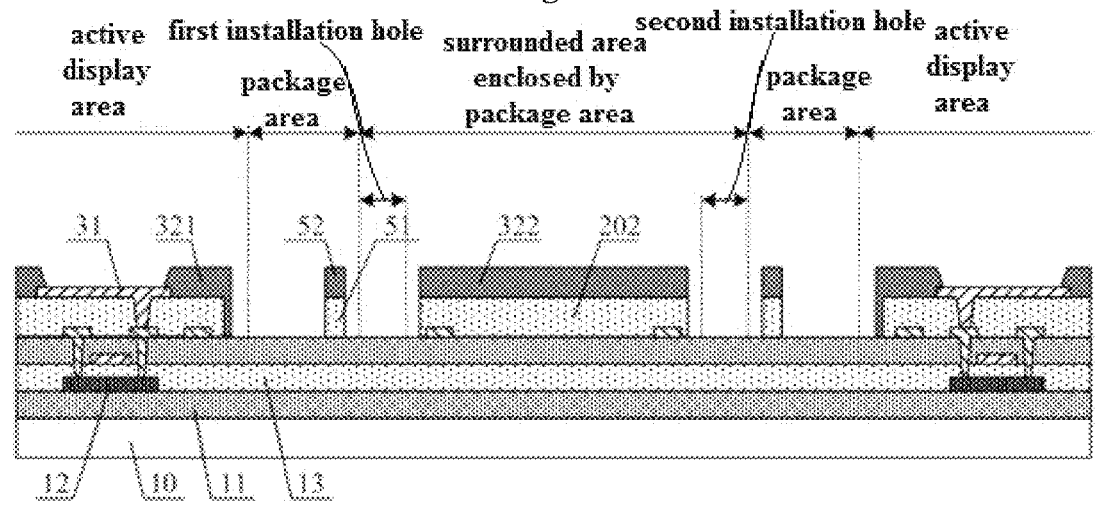
FIG. 4f is a structural schematic view of the display panel once it is formed with a pixel definition layer and a second sub-dam.

Sub-step S22: forming a pixel definition layer and a second sub-dam, specifically comprising: a pixel definition film is coated on aforementioned structures formed on the substrate, and then a pixel definition layer (PDL) and a second sub-dam 52 are formed through a lithography process of exposing with a mask and development. The pixel definition layer comprises a first pixel definition layer 321 located in the active display area, a second pixel definition layer 322 located in the surrounded area enclosed by the package area and between the first installation hole and the second installation hole; the second sub-dam 52 is stacked on the first sub-dam 51, with a portion of the pixel definition film at other positions being removed already, as illustrated in FIG. 4f. FIG. 4f is a structural schematic view of the display panel once it is formed with a pixel definition layer and a second sub-dam. At such a time, in the package area, there are formed with the third portion of the pattern of the buffer layer 11, the third portion of the pattern of the first insulation layer 13, the third portion of the pattern of the second insulation layer 15, the first sub-dam 51 on the second insulation layer 15, and the second sub-dam 52 stacked on the first sub-dam 51; in the surrounded area enclosed by the package area, at the positions of the first installation hole and the second installation hole, there are formed with the second portion of the pattern of the buffer layer 11, the second portion of the pattern of the first insulation layer 13, and the second portion of the pattern of the second insulation layer 15; in the surrounded area enclosed by the package area, at the inter-hole area between the first installation hole and the second installation hole, there are formed with the first portion of the pattern of the buffer layer 11, the first portion of the pattern of the first insulation layer 13, the first portion of the pattern of the second insulation layer 15, the first portion of the pattern of the data line 18, the second planarization layer 202 covering the first portion of the pattern of the data line 18, and the second pixel definition layer 322 located on the second planarization layer 202. The pixel definition layer is for example formed by polyimide, acrylic or polyethylene terephthalate. In this process, the shape of the first pixel definition layer 321 formed in the active display area is the same as that of in the relevant art.

Sub-step S23: forming a spacer column and a third sub-dam, specifically comprising: an organic film is coated on aforementioned structures as formed on the substrate, and then a spacer column 40 and a third sub-dam 53 are formed by a lithography process of exposing with a mask and development.

Figure 4G:
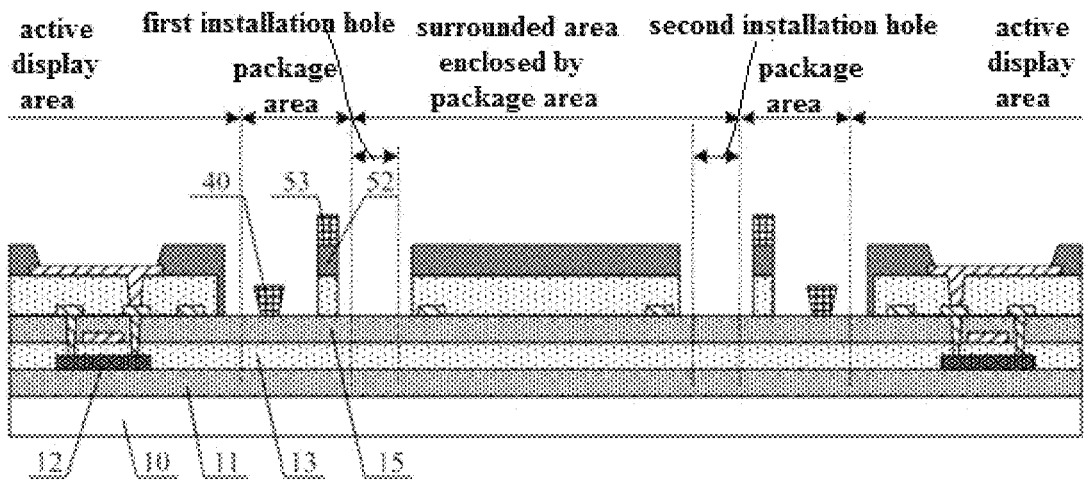
FIG. 4g is the structural schematic view of the display panel once it is formed with a spacer column and a third sub-dam.

The third sub-dam 53 is stacked on the second sub-dam 52; and the spacer column 40 is also located in the package area, just like the first sub-dam 51, the second sub-dam 52 and the third sub-dam 53; and the spacer column 40 is located on a side of the first sub-dam 51, the second sub-dam 52 and the third sub-dam 53 facing towards the active display area (i.e., as compared with the first sub-dam 51, the second sub-dam 52 and the third sub-dam 53, the spacer column 40 is located closer to external sides of the display panel in both lengthwise direction and widthwise direction thereof), with a portion of the organic film at other positions being removed already, as illustrated in FIG. 4g. FIG. 4g is the structural schematic view of the display panel once it is formed with a spacer column and a third sub-dam. At such a time, in the package area, there are formed with the third portion of the pattern of the buffer layer 11, the third portion of the pattern of the first insulation layer 13, the third portion of the pattern of the second insulation layer 15, the first sub-dam 51 on the second insulation layer 15, the second sub-dam 52 stacked on the first sub-dam 51 and the third sub-dam 53 stacked on the second sub-dam 52. In the package area, there is also formed with: the spacer column 40 located on a side of the first sub-dam 51, the second sub-dam 52 and the third sub-dam 53 facing towards the active display area, and on the second insulation layer 15; in the surrounded area enclosed by the package area, at positions of the first installation hole and the second installation hole, there are formed with the second portion of the pattern of the buffer layer 11, the second portion of the pattern of the first insulation layer 13, and the second portion of the pattern of the second insulation layer 15;

moreover, in the surrounded area enclosed by the package area, at the inter-hole area between the first installation hole and the second installation hole, there are formed with the first portion of the pattern of the buffer layer 11, the first portion of the pattern of the first insulation layer 13, the first portion of the pattern of the second insulation layer 15, the first portion of the pattern of the data line 18, the second planarization layer 202 covering the first portion of the pattern of the data line 18, and the second pixel definition layer 322 located on the second planarization layer 202.

The spacer column 40 is arranged to insert into and split each of the organic function layer and the cathode layer, both of which are formed subsequently (in other words, each of the organic function layer and the cathode layer is formed subsequently to be split apart at the spacer column 40 rather than being an successive integral layer distributed across the whole display panel), and thus is configured to prevent water and oxygen from escaping at respective side walls of the installation holes and in turn invading OLED (especially the active display area thereof), avoiding any adverse influence on the display quality brought about by the water and oxygen from the installation holes. In some embodiments, an orthogonal projection of one side of the spacer column 40 proximal to the substrate 10 on the substrate 10 falls within an orthogonal projection of an opposite side of the spacer column 40 distal to the substrate 10 on the substrate 10, by way of example, in the plane perpendicular to the substrate 10, the section of the spacer column 40 is in the form of an inverted trapezoidal shape structure, such that, when the organic function layer and the cathode are being formed subsequently, since once the materials of the organic function layer and the cathode accumulate both at a root portion of the spacer column 40 having the section of an inverted trapezoidal shape being in contact with the second insulation layer 15 and at a side wall of the spacer column 40, then these materials may either readily induce a local stress concentration there, or readily break off due to an inclined side wall of a profile of the spacer column 40 where they are attached, then, since these materials of the organic insulation layer and the cathode may not be firmly/securely attached or bonded to the spacer column 40, they may be stripped from the spacer column 40, facilitating that the spacer column 40 split apart each of the organic function layer and the cathode, avoiding water and oxygen from invading OLED through the side walls of the installation holes.

In some embodiments, the material forming the pixel definition layer and the second sub-dam is selected as a positive organic material (i.e., an organic material having the same optical property under light-illumination as a positive photoresist), for example a positive photoresist; and the material forming the spacer column and the third sub-dam is correspondingly selected to comprise a negative organic material (i.e., an organic material having the same optical property under light-illumination as a negative photoresist), for example a negative photoresist, such that the pixel definition layer and the second sub-dam are not affected when the spacer column and the third sub-dam are being formed. It may be readily understood that, in a condition that the material forming the pixel definition layer and the second sub-dam is a negative organic material (e.g., a negative photoresist), the material forming the spacer column and the third sub-dam comprises a positive organic material (e.g., a positive photoresist). Therefore, the material of the spacer column and the third sub-dam is opposite in optical property under light-illumination to the material of the pixel definition layer and the second sub-dam under light-illumination.

Figure 4H:
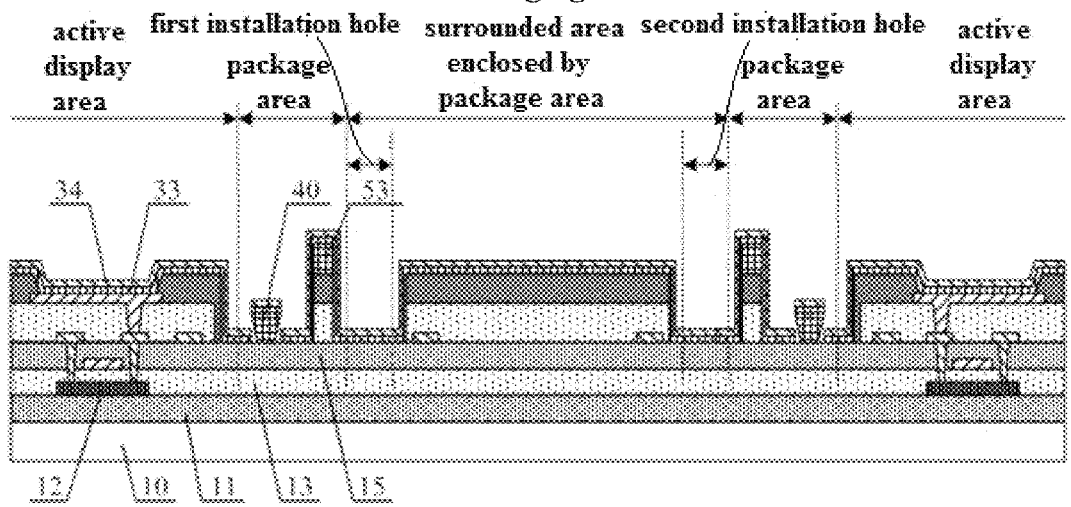
FIG. 4h is a structural schematic view of the display panel once it is formed with a cathode.

Sub-step S24: forming an organic function layer and a cathode, specifically comprising: the organic function layer 33 and the cathode 34 are sequentially formed on the aforementioned structures previously formed on the substrate, for example, the organic function layer 33 and the cathode 34 are formed by using relevant technical means in the art. The organic function layer 33 and the cathode 34 are arranged to cover the entire surface of the substrate, as illustrated in FIG. 4h. FIG. 4h is a structural schematic view of the display panel once it is formed with a cathode. In the package area, since the spacer column 40 provided therein has its structural characteristic of being wider at top and narrower at bottom, then the spacer column 40 may result in that each of the organic function layer 33 and the cathode 34 is broken and split at the side wall of the spacer column 40, a portion of the organic function layer 33 and the cathode 34 is located at the upper end of the spacer column 40, the other portion of the organic function layer 33 and the cathode 34 is located at the second insulation layer 15 on opposite sides of the spacer column 40, such that the organic function layer 33 and the cathode 34 are completely broken in the package area (especially at the spacer column 40), each of the organic function layer and the cathode is split apart between the active display area and the installation holes, preventing water and oxygen around the installation holes from entering the active display area along the organic function layer, enhancing a service life of components. At positions of the installation holes, the organic function layer and the cathode are formed on the second insulation layer 15, as illustrated in FIG. 4h.

Among others, the organic function layer 33 mainly comprises a light-emitting layer (EML). In practical implementation, the organic function layer for example comprises a hole injection layer, a hole transmission layer, a light-emitting layer, an electron transmission layer and an electron injection layer arranged sequentially in a direction facing away from the substrate to improve the efficiency of injecting electrons and holes into the light-emitting layer. The cathode is for example formed by a metal material such as magnesium (Mg), silver (Ag), aluminum (Al), copper (Cu), lithium (Li), etc, or an alloy thereof.

At such a time, in the surrounded area enclosed by the package area, at the inter-hole area between the first installation hole and the second installation hole, there are formed with the first portion of the pattern of the buffer layer 11 pattern, the first portion of the pattern of the first insulation layer 13, the first portion of the pattern of the second insulation layer 15, the first portion of the pattern of the data line 18, the second planarization layer 202 covering the first portion of the pattern of the data line, the second pixel definition layer 322 on the second planarization layer 202, the first portion of the pattern of the organic function layer 33 on the second pixel definition layer 322 and the first portion of the pattern of the cathode 34. In the surrounded area enclosed by the package area, at positions of the first installation hole and the second installation hole, there are formed with the second portion of the pattern of the buffer layer 11, the second portion of the pattern of the first insulation layer 13, the second portion of the pattern of the second insulation layer 15, the second portion of the pattern of the organic function layer 33 different from the first portion thereof, and the second portion of the pattern of the cathode 34 different from the first portion thereof. Moreover, in the package area, there are formed with the third portion of the pattern of the buffer layer 11, the third portion of the pattern of the first insulation layer 13, the third portion of the pattern of the second insulation layer 15, the first sub-dam 51 on the second insulation layer 15, the second sub-dam 52 stacked on the first sub-dam 51, and the third sub-dam 53 stacked on the second sub-dam 52; and in the package area, on the second insulation layer 15, there is further formed with the spacer column 40 located on a side of the first sub-dam 51, the second sub-dam 52 and the third sub-dam 53 facing towards the active display area; and in the package area, on the third sub-dam 53 and the spacer column 40, there are still further formed with the third portion of the pattern of the organic function layer 33 which is different from the first portion and the second portion of the pattern thereof, and the third portion of the pattern of the cathode 34 which is different from the first portion and the second portion of the pattern thereof.

Figure 4I:
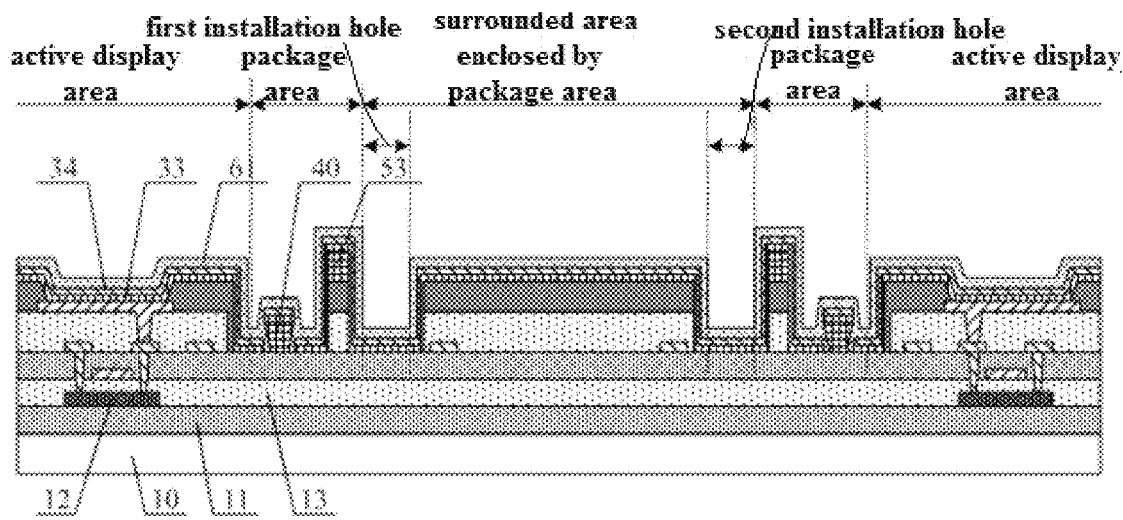
FIG. 4i is a structural schematic view of the display panel once it is formed with a first inorganic packaging layer.

Step S3: forming a packaging structure layer on the light-emitting structure layer. Specific processes of forming the packaging structure layer on the light-emitting structure layer comprise following sub-steps:

Sub-step S31: forming a first inorganic packaging layer, specifically comprising: a first inorganic film is deposited on the aforementioned structures previously formed on the substrate, the first inorganic film continuously covering the active display area, the package area and the surrounded area enclosed by the package area, thus forming the first inorganic packaging layer 61, as illustrated in FIG. 4i. FIG. 4i is a structural schematic view of the display panel once it is formed with a first inorganic packaging layer.

Figure 4J:
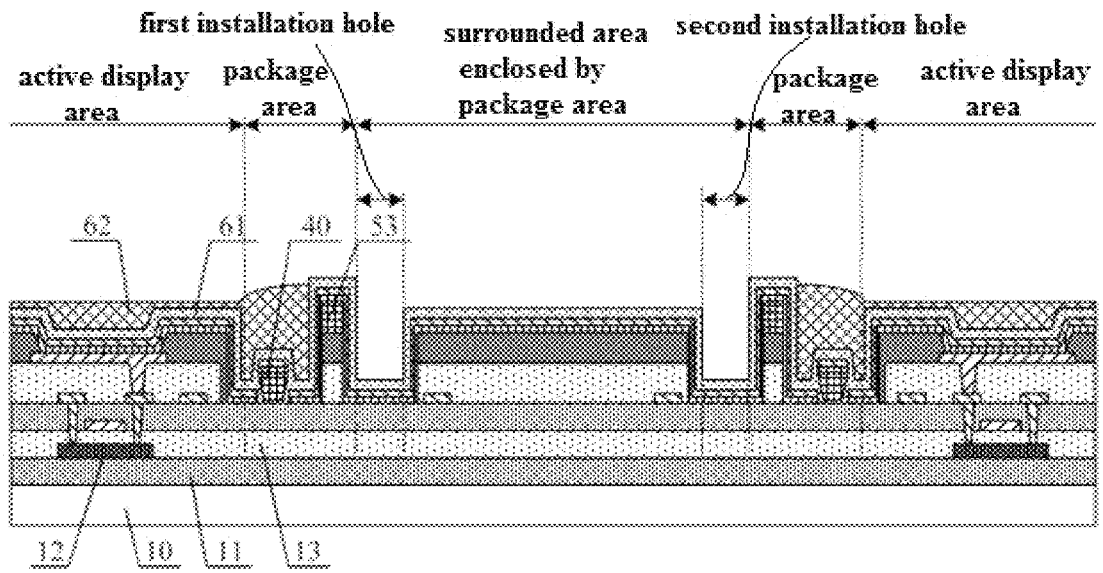
FIG. 4j is a structural schematic view of the display panel once it is formed with an organic packaging layer.

Sub-step S32: forming an organic packaging layer, specifically comprising: an organic packaging layer 62 is formed on the aforementioned structures previously formed on the substrate, in the active display area and the package area (for example, continuously). A printing method of Ink Jet Print (IJP) may be used to form an organic packaging solution in the active display area and package area, and then cure the organic packaging solution to form an organic packaging layer 62, as illustrated in FIG. 4j. FIG. 4j is a structural schematic view of the display panel once it is formed with an organic packaging layer. In the process of forming the organic packaging solution, the dam 50 prevents the organic package solution from overflowing or escaping into the surrounded area enclosed by the package area, so as to prevent the organic package solution from overflowing or escaping to reach the positions of the first installation hole and the second installation hole.

At this time, in the package area, there is also formed with an organic packaging layer 62 on the first inorganic packaging layer 61, without any portion of the organic packaging layer being provided in the surrounded area enclosed by the package area, that is, there is no material of the organic packaging layer at the positions of the first installation hole and the second installation hole.

Figure 4K:
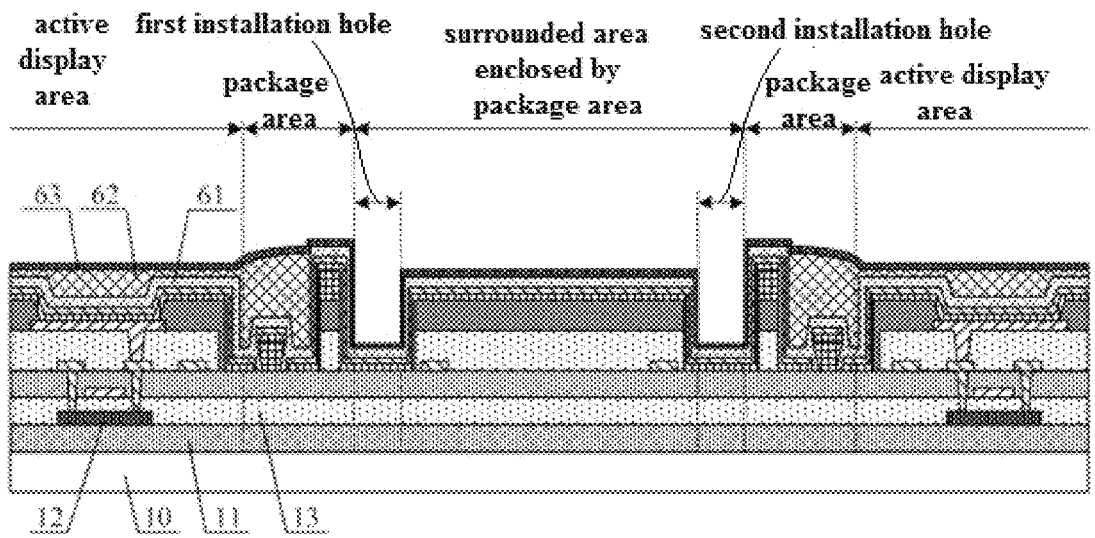
FIG. 4k is a structural schematic view of the display panel once it is formed with a second inorganic packaging layer.

Sub-step S33: forming a second inorganic packaging layer, specifically comprising: a second inorganic film is deposited on the aforementioned structures previously formed on the substrate, the second inorganic film continuously covering the active display area, the package area and the surrounded area enclosed by the package area, thus forming the second inorganic packaging layer 63, as illustrated in FIG. 4k. FIG. 4k is a structural schematic view of the display panel once it is formed with a second inorganic packaging layer.

Among others, in the active display area and package area, the packaging structure layer is a triple-layered structure of one intermediate organic layer interposed between two inorganic layers (i.e., referred to as "upper inorganic layer" and "lower inorganic layer" hereinafter), and the intermediate organic layer is formed in both the active display area and the package area, while both the upper inorganic layer and the lower inorganic layer covering the active display area, the package area and the surrounded area enclosed by the package area, so as to complete the packaging of the display panel.

Finally, respective portions of various structural film layers at the first installation hole and the second installation hole, and a respective portion of the substrate there, are etched out by laser and other relevant processes to form an OLED display panel according to the embodiments of the disclosure, as illustrated in FIG. 3. In practical implementation, for example, respective portions of all structural film layers at the first installation hole and the second installation hole, and a respective portion of the substrate there are etched to form through-holes; or alternatively, portions of the structural film layers at the installation holes are partially etched to form blind holes instead, as per practical requirements, without being specifically limited in embodiments of the disclosure.

It may be readily understood that, the installation holes are formed at the positions at which the installation holes are desired to be formed, for example, before the planarization film is coated, or alternatively before the first inorganic film is formed, or otherwise alternatively after the second inorganic film is formed, which can be determined as per practical requirements.

As compared with the display panel in the relevant art as shown in FIG. 1a and FIG. 1b, as illustrated in FIG. 2a and FIG. 3, the package area 300 of the display panel according to the embodiments of the present inventions is provided around at least two installation holes which space apart from each other or one another (e.g., the first installation hole and the second installation hole), without any portion of the organic packaging layer being provided between the first installation hole and the second installation hole, such that neither any spacer column nor any dam is required to be provided between the first installation hole and the second installation hole. As such, the inter-hole area between the first installation hole and the second installation hole in the surrounded area enclosed by the package area, may be completely utilized to function as the wiring area. As compared with the fact as illustrated in FIG. 1b that the inter-hole area between the first packaging area and the second packaging area may merely partially be used as a wiring area for routing wirings therein (since there is additionally provided with spacer column and dam therein), then the width of the wiring area in FIG. 4 is much larger than (e.g., the width of such wiring area may be approximately 700 μm to 800 μm) that of the wiring area as illustrated in FIG. 1b. The wiring area is configured such that wirings, such as data lines, are provided therein; provided that both width of and spacing between data lines remain unchanged, then, in the wiring area whose specific area is increased in embodiments as illustrated in FIG. 4, the data line may be laid to occupy/cover larger area, thus reducing the difficulty in laying wirings in the display panel. Moreover, provided that width, spacing and number of data line(s) between the first installation hole and the second installation hole remain unchanged, then it means that the width of the wiring area as required in FIG. 4 may be decreased; as such, the distance between the first installation hole and the second installation hole may then be further reduced (that is, the first installation hole and the second installation hole may be set closer to each other), and thereby the area of the surrounded area enclosed by the package area may in turn be reduced, resulting in a contracted outer boundary of the package area 300, thus increasing the area of the active display area and improving the display quality and user's satisfaction of the full screen.

It may be readily understood that, the active display area is a difference between the area of the display area (i.e., area labeled by 'AA') and an area surrounded by outer boundary of the package 300 (i.e., comprising both the package area and the surrounded area enclosed by the package area); then, in a condition that the outer boundary of the package 300 is contracted/decreased, the area surrounded by the outer boundary of the package 300 is also reduced accordingly, resulting in an increased area of the active display area.

In the relevant art, as illustrated in FIG. 1b, an organic packaging layer will be formed between the first installation hole and the second installation hole by means of ink-jet printing, and the dams between the first installation hole and the second installation hole are used to prevent an organic solution in the process of ink-jet printing from overflowing to the positions of the installation holes. In the embodiments of the disclosure, the package area 300 is provided around at least two installation holes which space apart from each other or one another (e.g., the first installation hole and the second installation hole), without forming any organic packaging layer between the first installation hole and the second installation hole by means of ink-jet printing, such that it is also unnecessary to provide any spacer column or dam therebetween, not only facilitating increasing the width of the wiring area, but also preventing the organic solution between the first installation hole and the second installation hole from overflowing therefrom during ink-jet printing, thus avoiding erosion due to water and oxygen, and prolonging the service life of OLED devices.

In the display panel according to the embodiments of the disclosure, the spacer column is disposed to insert into and split apart each of the organic function layer and the cathode, thereby, alternatively, the organic function layer and the cathode may be formed on the entire substrate by evaporation, rather than utilizing the "patterning process" for the organic function layer and the cathode; therefore, both the difficulty in preparation and the production cost of both the organic function layer and the cathode may be reduced.

It should be noted that, the structure illustrated in the embodiments and the process for preparing the same are merely an exemplary description. In the actual implementation, as per practical requirements, the corresponding structure may be changed, and the patterning processes or photolithography processes may be increased or reduced. By way of example, as to the OLED display panel, it may for example be selected to be in the form of a top emission structure, or alternatively may for example be selected to be in the form of a bottom emission structure. Furthermore, the thin film transistor may for example be selected to be in the form of a top gate structure, or alternatively may for example be selected to be in the form of a bottom gate structure; and the thin film transistor may for example be selected to be in the form of a double gate structure, or alternatively may for example be selected to be in the form of a single gate structure. Moreover, the thin film transistor may for example be an amorphous silicon (a-Si) thin film transistor, a low-temperature polycrystalline silicon (LTPS) thin film transistor or an oxide thin film transistor. In the driving structure layer and the light-emitting structure layer, there may further be additionally provided with other electrodes, lead wires and structure film layers, for example. Here no specific limitations may be made in the embodiments of the disclosure.

As illustrated in FIG. 2b, it can be seen in a plane parallel to the display panel that, the first installation hole 100 and the second installation hole are round holes each having a circular cross-section, and the package area is for example defined to be in the form of a segmented form as below: namely, the package area comprises: a first package section 304 arranged along a periphery of the first installation hole 100, a second package section 305 arranged along a periphery of the second installation hole 200, and a third package section 306 connecting between the first package section 304 and the second package section 305 and functioning as a transition package section therebetween, the third package section being a straight section. In the embodiments, the first installation hole 100 and the second installation hole 200 are both circular holes. In order to further reduce the outer boundary of the package area 300, the third package section is tangent to the edges or peripheries of both the first installation hole 100 and the second installation hole 200.

Figure 5:
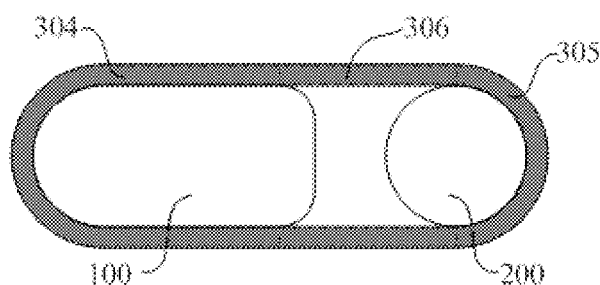
FIG. 5 is a structural schematic view of a package area in another embodiment.

In another embodiment, as illustrated in FIG. 5, which is a structural schematic view of a package area in another embodiment, the first installation hole 100 is an elongate runway hole, and the second installation hole is a circular hole. The package area comprises: a first package section 304 arranged along a periphery of the first installation hole 100, a second package section 305 arranged along a periphery of the second installation hole 200, and a third package section 306 connecting between the first package section 304 and the second package section 305 and functioning as a transition package section therebetween, the third package section being a straight section. In other embodiments, the first installation hole and the second installation hole may also be in other shapes such as oval shape or square shape, diamond shape, etc.

In other embodiments of the present disclosure:

Based on the technical concept of the embodiments of the disclosure, a method for preparing a display panel is further proposed in the embodiments of the disclosure. The display panel comprises a display area provided with at least two installation holes therein which space apart from each other or one another (e.g., the first installation hole and the second installation hole), and the display area also comprises a package area provided around the at least two installation holes which space apart from each other or one another (e.g., the first installation hole and the second installation hole), and the method for preparing the display panel comprises:

forming an insulation layer on a substrate, the insulation layer extending into an inter-hole area between the first installation hole and the second installation hole (specifically, a portion of a buffer layer, a portion of a first insulation layer, and a portion of a second insulation layer fall into the range of the inter-hole area, the buffer layer, the first insulation layer and the second insulation layer being stacked on one another sequentially);

forming an inorganic packaging layer on the insulation layer, the inorganic packaging layer extending into the inter-hole area between the first installation hole and the second installation hole (specifically, a portion of the first inorganic packaging layer as mentioned above and a portion of the second inorganic packaging layer as mentioned above fall into the range of the inter-hole area); and forming an organic packaging layer provided to abut against the inorganic packaging layer, the organic packaging layer failing to extend into the inter-hole area between the first installation hole and the second installation hole.

In some embodiments, the inorganic packaging layer is formed on the insulation layer, in the inter-hole area between the first installation hole and the second installation hole, for example more specifically comprising:

forming a data line on the insulation layer in the inter-hole area between the first installation hole and the second installation hole (specifically, a portion of the data line falling into the inter-hole area);

forming a second planarization layer and/or a second pixel definition layer on data line in the inter-hole area between the first installation hole and the second installation hole;

forming an inorganic packaging layer on the second planarization layer and/or the second pixel definition layer in the inter-hole area between the first installation hole and the second installation hole (specifically, a portion of the inorganic packaging layer falling into the inter-hole area).

In some embodiments, the inorganic packaging layer is formed on the second planarization layer and/or the second pixel definition layer in the inter-hole area between the first installation hole and the second installation hole, for example more specifically further comprising:

forming an organic function layer on the second planarization layer and/or the second pixel definition layer in the inter-hole area between the first installation hole and the second installation hole (specifically, a portion of the organic function layer falling into the inter-hole area); and forming a cathode on the organic function layer in the inter-hole area between the first installation hole and the second installation hole (specifically, a portion of the cathode falling into the inter-hole area).

In some embodiments, the method for preparing the display panel further comprises: forming the insulation layer on the substrate in the package area (specifically, the portion of the insulation layer falling into the package area);

forming a dam on the insulation layer in the package area;

forming a first inorganic packaging layer on the dam in the package area (specifically, the portion of the first inorganic packaging layer falling into the package area);

forming an organic packaging layer on the first inorganic packaging layer in the package area with an ink-jet printing method (specifically, the portion of the organic packaging layer falling into the package area); and forming a second inorganic packaging layer on the organic packaging layer in the package area (specifically, the portion of the second inorganic packaging layer falling into the package area).

In some embodiments, an area which falls within the display area and is located outside the package area functions as an active display area, and the dam comprises a first sub-dam and a second sub-dam sequentially stacked on a surface of the insulation layer, and correspondingly, the method for preparing the display panel further comprises:

forming a thin film transistor structure layer on the substrate in the active display area, with the insulation layer being formed in the process of forming the thin film transistor structure layer;

forming a first planarization layer on the thin film transistor structure layer in the active display area, with the first sub-dam and the first planarization layer being both formed in a same masking process (i.e., they are formed in a same layer, and the same masking process for example comprises: coating a planarization film, and then patterning the planarization film by the lithography process of exposing with a mask, and development);

forming an anode on the first planarization layer in the active display area; and forming a first pixel definition layer on the anode in the active display area, the second sub-dam and the first pixel definition layer being both formed in another same masking process (i.e., they are formed in a same layer, and the another same masking process for example comprises: coating a pixel definition film, and then using the lithography process of exposing with a mask, and development).

In some embodiments, the dam further comprises a third sub-dam stacked on the second sub-dam, and after the first pixel definition layer is formed on the anode in the active display area, the method for preparing the display panel further comprises:

forming a spacer column on the insulation layer in the package area, the third sub-dam and the spacer column being both formed in still another same masking process (i.e., they are formed in a same layer, and the still another same masking process for example comprises: coating an organic film, and then using the lithography process of exposing with a mask, and development).

In such embodiments, specific structures, materials, relevant parameters and detailed preparation process of various film layers have been described in detail in the aforementioned embodiments, and will not be repeated here.

In still other embodiments of the present disclosure:

Based on the inventive concept of the above embodiments, the embodiment of the disclosure further provides a display device, which comprises the display panel according to the above embodiments. The display device may for example be any product or component having display function, such as mobile phone, tablet computer, television, display, laptop computer, digital photo frame, navigator, and the like.

As compared with relevant art, on the basis of above technical solutions, the display device and the method for preparing the same, as well as the display device according to embodiments of the disclosure at least have beneficial effects as follows:

in the display panel according to embodiments of the disclosure, the package area is provided around at least two installation holes which space apart from each other or one another (e.g., the first installation hole and the second installation hole), without any portion of the organic packaging layer being provided between the first installation hole and the second installation hole. As such, neither spacer column nor dam is required to be provided between the first installation hole and the second installation hole any more. Therefore, as compared with a wiring area in relevant art (which is defined as an area between the first package area and the second package area), the inter-hole area between the first installation hole and the second installation hole in the surrounded area enclosed by the package area, according to the embodiments of the disclosure, which inter-hole area functions as the wiring area, may be further decreased in total area, so as to reduce the distance between the first installation hole and the second installation hole, and in turn to decrease the area of the surrounded area enclosed by the package area, resulting in a contracted outer boundary of the package area, thus increasing the area of the active display area and improving the display quality and user's satisfaction of the full screen.

In the description of embodiments of the disclosure, it should be understood that, terms "middle/intermediate", "on/above", "under/below", "front", "back", "vertical", "horizontal", "top", "bottom", "inside", "outside" and the like, indicate respective orientational or positional relationship which is based on the orientational or positional relationship as illustrated in the drawings, merely intending to facilitate describing the disclosure and simplifying the depiction, rather than indicating or implying that the devices or elements as referred to have to be oriented in a specific orientation/direction, to be constructed and to operate in a specific orientation, thus the terms may not be understood as a limitation of the disclosure.

In the description of embodiments of the disclosure, it should be noted that unless otherwise specified and defined, the terms "installation" and "connection" should be understood in a broader sense; for example, it may be a fixed connection, or alternatively a detachable connection, or otherwise an integrated connection; it may also be a mechanical connection, or an electrical connection; it may further be a direct connection, or an indirect connection via an intermediate medium, or may be an internal connection inside two components. For those of ordinary skill in the art, the specific meaning of the above terms in embodiments of the disclosure may be understood in specific conditions.

Although the disclosed embodiment of the disclosure is as above, the content is merely intended for facilitating understanding the embodiments of the disclosure, rather than being used to define the embodiments of the disclosure. Any person skilled in the art of the disclosure may make any modification and change in the form and details of the implementation without departing from the spirit and scope disclosed in the disclosure, and the scope of patent protection of the disclosure shall still be subject to the scope defined in the appended claims.

What is claimed is:

1. A display panel, comprising a display area, wherein the display area comprises: a package area which is a single one and is formed to be closed; a surrounded area enclosed by the package area, with at least two installation holes which are formed in the surrounded area and space apart from each other or one another, the at least two installation holes comprising a first installation hole and a second installation hole; and an active display area, which is defined as an external area surrounding the package area within the display area, and wherein in a plane perpendicular to the display panel, the display panel comprises a substrate, an insulation layer provided on the substrate, and a packaging structure layer provided on the insulation layer, all of the substrate, the insulation layer and the packaging structure layer being stacked, the packaging structure layer comprising an inorganic packaging layer and an organic packaging layer, the inorganic packaging layer extending into an inter-hole area between the first installation hole and the second installation hole in the surrounded area enclosed by the package area, and the organic packaging layer failing to extend into the surrounded area.

2. The display panel according to claim 1, wherein the package area is in a form of a closed loop belt.

3. The display panel according to claim 1, wherein the package area comprises: a first package section arranged along a periphery of the first installation hole, a second package section arranged along a periphery of the second installation hole, and a third package section connecting between the first package section and the second package section and functioning as a transition package section therebetween, the third package section being a straight section.

4. The display panel according to claim 1, wherein, in the plane perpendicular to the display panel, the package area is formed with: a portion of the substrate falling within the package area, a portion of the insulation layer on the substrate falling within the package area, and a dam provided on the insulation layer; and wherein the inorganic packaging layer comprises a first inorganic packaging layer and a second inorganic packaging layer, and the package area is further formed with: respective portions of the first inorganic packaging layer, the organic packaging layer and the second inorganic packaging layer which are stacked on the dam and fall within the package area.

5. The display panel according to claim 4, wherein the package area is further formed with a spacer column provided on the insulation layer, the spacer column is located on a side of the dam facing away from the first installation hole or the second installation hole, and the package area is further formed with: respective portions of an organic function layer and a cathode layer which are stacked on both the dam and the spacer column and fall within the package area, respectively, and the spacer column is arranged to insert into and split each of the organic function layer and the cathode layer on both sides of the spacer column, and the first inorganic packaging layer is located on the cathode.

6. The display panel according to claim 5, wherein, in the plane perpendicular to the display panel, the active display area surrounding the package area is formed with: a portion of the substrate falling within the active display area, a thin film transistor structure layer provided on the substrate, a first planarization layer provided on the thin film transistor structure layer, an anode layer provided on the first planarization layer, and a first pixel definition layer provided on the anode layer; and wherein the dam comprises a first sub-dam and a second sub-dam sequentially stacked on a surface of the insulation layer, the first sub-dam and the first planarization layer are made of a same material and in a same layer, and the second sub-dam and the first pixel definition layer are made of a same material and in a same layer.

7. The display panel according to claim 6, wherein the dam further comprises a third sub-dam stacked on the second sub-dam, and the third sub-dam and the spacer column are made of a same material and in a same layer.

8. The display panel according to claim 1, wherein, in the plane perpendicular to the display panel, the inter-hole area between the first installation hole and the second installation hole in the surrounded area enclosed by the package area comprises: a portion of data lines provided on the insulation layer falling within the inter-hole area, and a second planarization layer and/or a second pixel definition layer provided on the portion of the data lines falling within the inter-hole area, and the inorganic packaging layer is located on the second planarization layer and/or the second pixel definition layer.

9. The display panel according to claim 8, wherein the inter-hole area between the first installation hole and the second installation hole in the surrounded area enclosed by the package area is further formed with: respective portions of an organic function layer and a cathode layer which are stacked on the second planarization layer and/or the second pixel definition layer and fall within the inter-hole area, and the inorganic packaging layer is located on the cathode.

10. A display device, comprising the display panel according to claim 1.

11. A method for preparing a display panel, wherein the display panel comprises a display area, the display area comprises: a package area which is a single one and is formed to be closed; a surrounded area enclosed by the package area, with at least two installation holes which are formed in the surrounded area and space apart from each other or one another, the at least two installation holes comprising a first installation hole and a second installation hole; and an active display area, which is defined as an external area surrounding the package area within the display area, and the method comprises:

forming an insulation layer on a substrate, the insulation layer extending into an inter-hole area between the first installation hole and the second installation hole in the surrounded area enclosed by the package area; and forming a packaging structure layer provided on the insulation layer, the packaging structure layer comprising an inorganic packaging layer and an organic packaging layer, the inorganic packaging layer extending into the inter-hole area between the first installation hole and the second installation hole in the surrounded area enclosed by the package area, and the organic packaging layer failing to extend into the inter-hole area.

12. The preparation method according to claim 11, wherein the insulation layer extends into the package area, and the method further comprises:

forming a dam on the insulation layer in the package area, after the insulation layer is formed on the substrate but before the packaging structure layer is formed on the insulation layer.

13. The preparation method according to claim 12, wherein, in a process of forming the packaging structure layer on the insulation layer, forming the inorganic packaging layer comprises:

forming a first inorganic packaging layer, the first inorganic packaging layer extending into the package area and covering the dam; and forming a second inorganic packaging layer, the second inorganic packaging layer covering the organic packaging layer in the package area.

14. The preparation method according to claim 13, wherein forming a packaging structure layer provided on the insulation layer further comprises: forming the organic packaging layer on the first inorganic packaging layer in the package area, with an ink-jet printing method, after the first inorganic packaging layer is formed but before the second inorganic packaging layer is formed.

15. The preparation method according to claim 12, wherein the active display area is an area which falls within the display area and is located outside the package area, and the dam comprises a first sub-dam and a second sub-dam sequentially stacked on a surface of the insulation layer, and the method further comprises:

forming a thin film transistor structure layer on the substrate in the active display area, with the insulation layer being formed in the process of forming the thin film transistor structure layer;

forming a first planarization layer on the thin film transistor structure layer in the active display area, with the first sub-dam and the first planarization layer being both formed in a same masking process;

forming an anode on the first planarization layer in the active display area; and forming a first pixel definition layer on the anode in the active display area, the second sub-dam and the first pixel definition layer both being formed in another same masking process.

16. The preparation method according to claim 15, wherein the dam further comprises a third sub-dam stacked on the second sub-dam, and after the first pixel definition layer is formed on the anode in the active display area, the method further comprises:

forming a spacer column on the insulation layer in the package area, the third sub-dam and the spacer column being both formed in still another same masking process.

17. The preparation method according to claim 11, wherein forming a packaging structure layer provided on the insulation layer comprises:

forming data lines on the insulation layer, a portion of the data lines falling within the inter-hole area between the first installation hole and the second installation hole;

forming a second planarization layer and/or a second pixel definition layer in the inter-hole area between the first installation hole and the second installation hole in the surrounded area enclosed by the package area, the second planarization layer and/or the second pixel definition layer covering the portion of the data lines falling within the inter-hole area between the first installation hole and the second installation hole; and forming the inorganic packaging layer, the inorganic packaging layer extending into the inter-hole area between the first installation hole and the second installation hole in the surrounded area enclosed by the package area, and covering the second planarization layer and/or the second pixel definition layer.

18. The preparation method according to claim 17, wherein forming a packaging structure layer provided on the insulation layer further comprises, prior to forming the inorganic packaging layer:

forming an organic function layer, the organic function layer extending into the inter-hole area between the first installation hole and the second installation hole and covering the second planarization layer and/or the second pixel definition layer by directly abutting thereon; and forming a cathode covering the organic function layer, the cathode extending into the inter-hole area between the first installation hole and the second installation hole.

\* \* \* \* \*

UNITED STATES PATENT AND TRADEMARK OFFICE
CERTIFICATE OF CORRECTION

| | |
|---|---|
| PATENT NO. | : 10,937,998 B1 |
| APPLICATION NO. | : 16/825034 |
| DATED | : March 2, 2021 |
| INVENTOR(S) | : Hao Zhang et al. |

It is certified that error appears in the above-identified patent and that said Letters Patent is hereby corrected as shown below:

On the Title Page

Item (71), insert --BOE TECHNOLOGY GROUP CO., LTD., Beijing (CN)-- after Chengdu BOE Optoelectronics Technology Co., Ltd., Chengdu (CN).

Signed and Sealed this
Seventh Day of February, 2023

Katherine Kelly Vidal
*Director of the United States Patent and Trademark Office*